(12) United States Patent
Qureshi et al.

(10) Patent No.: US 7,245,527 B2
(45) Date of Patent: Jul. 17, 2007

(54) NONVOLATILE MEMORY SYSTEM USING MAGNETO-RESISTIVE RANDOM ACCESS MEMORY (MRAM)

(75) Inventors: Qadeer A. Qureshi, Dripping Springs, TX (US); Thomas Jew, Austin, TX (US); Curtis F. Wyman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 122 days.

(21) Appl. No.: 11/130,351

(22) Filed: May 16, 2005

(65) Prior Publication Data

US 2006/0256610 A1   Nov. 16, 2006

(51) Int. Cl.
*G11C 11/14* (2006.01)
(52) U.S. Cl. .................. 365/171; 365/185.01
(58) Field of Classification Search ........... 365/171, 365/185.01, 189.01, 189.05
See application file for complete search history.

(56) References Cited

U.S. PATENT DOCUMENTS

| 5,604,881 | A | 2/1997 | Thomas |
| 5,701,516 | A | 12/1997 | Cheng et al. |
| 6,567,307 | B1 | 5/2003 | Estakhri |
| 6,691,205 | B2 | 2/2004 | Zilberman |
| 6,707,748 | B2 | 3/2004 | Lin et al. |
| 6,728,845 | B2 * | 4/2004 | Adiletta et al. ............. 711/154 |
| 2005/0010712 | A1 * | 1/2005 | Kim et al. .................. 710/315 |
| 2005/0068802 | A1 * | 3/2005 | Tanaka ....................... 365/145 |

OTHER PUBLICATIONS

"256K×16-Bit 3.3-V Asynchronous Magnetoresistive RAM," Freescale Semiconductor, Inc., Advance Information, MR2A16A/D; Rev. 0.1, Jul. 2004.
"MRAM," Freescale Semiconductor, Inc., Process Technology, Rev. 4, 2004.
"A low power 1Mbit MRAM based on 1T1MTJ bit cell integrated with Copper Interconnects," M. Durlam et al., Motorola Labs and Motorola Semiconductor Products Sector, VLSI Symposium, 2002.

* cited by examiner

*Primary Examiner*—Vu A. Le
(74) *Attorney, Agent, or Firm*—Larson Newman Abel Polansky & White, LLP

(57) ABSTRACT

A non-volatile memory system (230) includes a magnetoresistive random access memory (MRAM) (232) including a plurality of magnetoresistive memory cells, a floating-gate nonvolatile memory (234) including a plurality of floating-gate memory cells, and a controller (236) coupled to the MRAM (232) and to the floating-gate nonvolatile memory (234). The controller (236) is adapted to be coupled to a system bus (220) and controls a selected one of the MRAM (232) and the floating-gate nonvolatile memory (234) in response to an access initiated from the system bus (220).

20 Claims, 5 Drawing Sheets

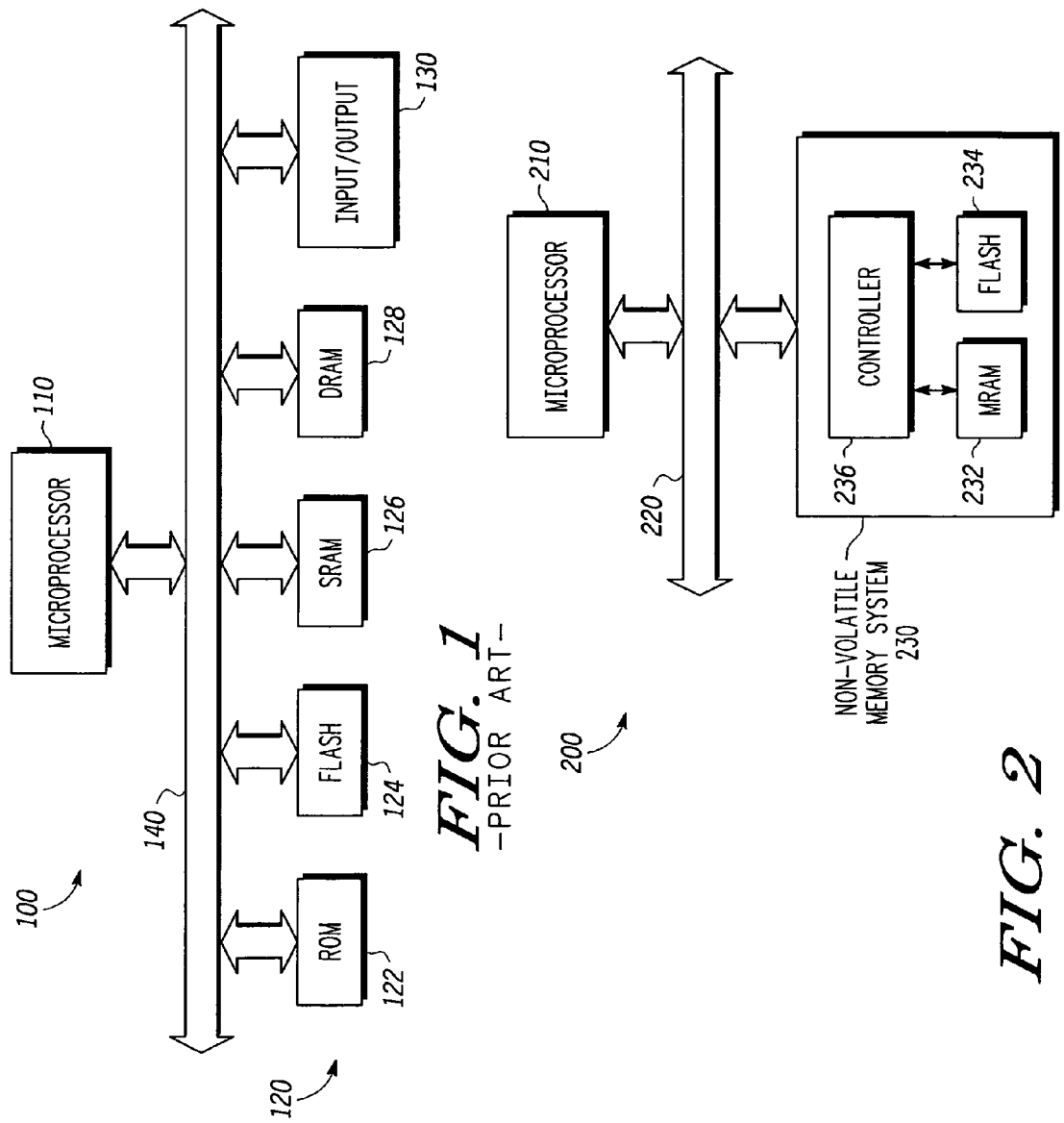

NONVOLATILE MEMORY SYSTEM USING MAGNETO-RESISTIVE RANDOM ACCESS MEMORY (MRAM)

FIELD OF THE DISCLOSURE

The invention relates generally to memory devices, and more particularly to nonvolatile memory systems.

BACKGROUND

Computer systems are usually defined as having three main blocks: a central processing unit (CPU), memory, and input/output peripherals. Over the past half-century or so developments in integrated circuit technology have made computers inexpensive and therefore common in everyday life, for all types of uses including desktop personal computers, cellular telephones, automobile engine controllers, and the like.

Integrated circuit technology has greatly reduced the cost of all components of the computer system. For example CPUs are now implemented with single-chip microprocessors. Modern microprocessors can achieve computing performance that was only available to supercomputers just a generation ago.

The integrated circuit revolution has also reduced the cost of computer memory. FIG. 1 illustrates a computer system 100 known in the prior art. Computer system 100 includes a microprocessor 110, a memory 120, and an input/output system 130 all connected together by means of a system bus 140. As shown in FIG. 1 memory 120 includes several different types of memory devices, including a read-only memory (ROM) 122, a flash electrically-erasable programmable ROM (FLASH) 124, a static random access memory (SRAM) 126, and a dynamic random access memory (DRAM) 128. Computer system 100 requires some or all of these different types of memory devices because integrated circuit technology has so far failed to produce a single type of memory device that meets all the needs of computer system 100.

ROM 122 is nonvolatile, permanent storage that is inexpensive but cannot be re-written. ROM 122 is implemented using mask-programmable single-transistor memory cells and requires custom masks but is inexpensive to manufacture. ROM 122 stores a program executable by microprocessor 110 that is not expected to change over the lifetime of computer system 100. A typical use of ROM 122 is to store the basic input/output system (BIOS) of a desktop computer.

FLASH 124 is nonvolatile memory that may use floating-gate transistors to store electrical charges that indicate the state of the memory cells. Relatively large portions or sectors of FLASH 124 can be erased "in a flash". However FLASH 124 is somewhat more expensive than ROM 122 and a program operation to write new data takes much longer than a read operation. Furthermore FLASH 124 has a reliability problem known as endurance, in that it loses its ability to be re-programmed over time after a large number of erase and program cycles have been performed. Because of these characteristics FLASH 124 is used to store parameters and user settings that stay relatively constant. For example, if computer system 100 were used in a cellular telephone, FLASH 124 could be used to store phone numbers in an electronic "phone book".

SRAM 126 is randomly accessible at high speed for both reads and writes, but it volatile and relatively expensive. SRAM 126 includes memory cells implemented as addressable static latches. Thus it is usually reserved for use as a high-speed scratchpad memory or cache for microprocessor 110.

DRAM 128 is randomly accessible and inexpensive, but is slower than SRAM 126 and is volatile. DRAM 128 is commonly implemented using storage cells that each include a capacitor and a single transistor, and thus can achieve high density and low price per bit. However because the charges stored in the memory cells are dynamic, the memory cells must be periodically refreshed. DRAMs are commonly used for storage of large programs that are loaded from input/output devices such as compact discs (CDs) and hard disk drives.

It should be apparent that any actual computer system may not use all types of memory devices shown in FIG. 1.

In recent years semiconductor manufacturers have developed a new type of memory known as magneto-resistive random access memory (MRAM) that may one day unify the available types of memory devices. MRAM is based on small storage cells that store states using magnetic fields. MRAM is non-volatile, randomly accessible, and capable of high-density integration. However as of yet manufacturing techniques have not been developed to produce MRAM at costs comparable to FLASH or DRAM at comparable densities.

Therefore what is needed is a new memory system capable of taking advantage of the properties of MRAM while it remains more expensive than these other types of memory.

BRIEF SUMMARY

Thus in one form the present invention provides a nonvolatile memory system including a magnetoresistive random access memory (MRAM) including a plurality of magnetoresistive memory cells, a flash nonvolatile memory, and a controller coupled to the MRAM and to the flash nonvolatile memory. The controller is adapted to be coupled to a system bus and controls a selected one of the MRAM and the flash nonvolatile memory in response to an access initiated from the system bus.

In another form, the present invention provides a nonvolatile memory system including a magnetoresistive random access memory (MRAM), a flash nonvolatile memory, and a controller coupled to the MRAM and to the flash nonvolatile memory. The MRAM has a plurality of sectors of MRAM cells and a corresponding plurality of tags. Each of the plurality of tags indicates an address of a corresponding one of the plurality of sectors. The flash nonvolatile memory has a second plurality of sectors of storage locations. The controller is coupled to the MRAM and to the flash nonvolatile memory and is adapted to be coupled to a system bus. In response to an access cycle received from the system bus, the controller determines whether an address of the access cycle is stored in one of the plurality of tags and if so performs the access cycle to a corresponding one of the plurality of sectors of the MRAM instead of to the flash nonvolatile memory.

In another form the present invention provides a method of controlling a non-volatile memory system that includes a magneto-resistive random access memory (MRAM) and a flash nonvolatile memory. An access cycle is received from a system bus. Whether the access cycle is a write cycle is determined. If the access cycle is the write cycle, write data is stored in a temporary buffer, the write cycle is terminated on the system bus, and the write data is subsequently stored in the MRAM.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

FIG. 1 illustrates in block diagram form a computer system known in the prior art;

FIG. 2 illustrates in block diagram form a computer system according to the present invention;

DETAILED DESCRIPTION

Figure 3:
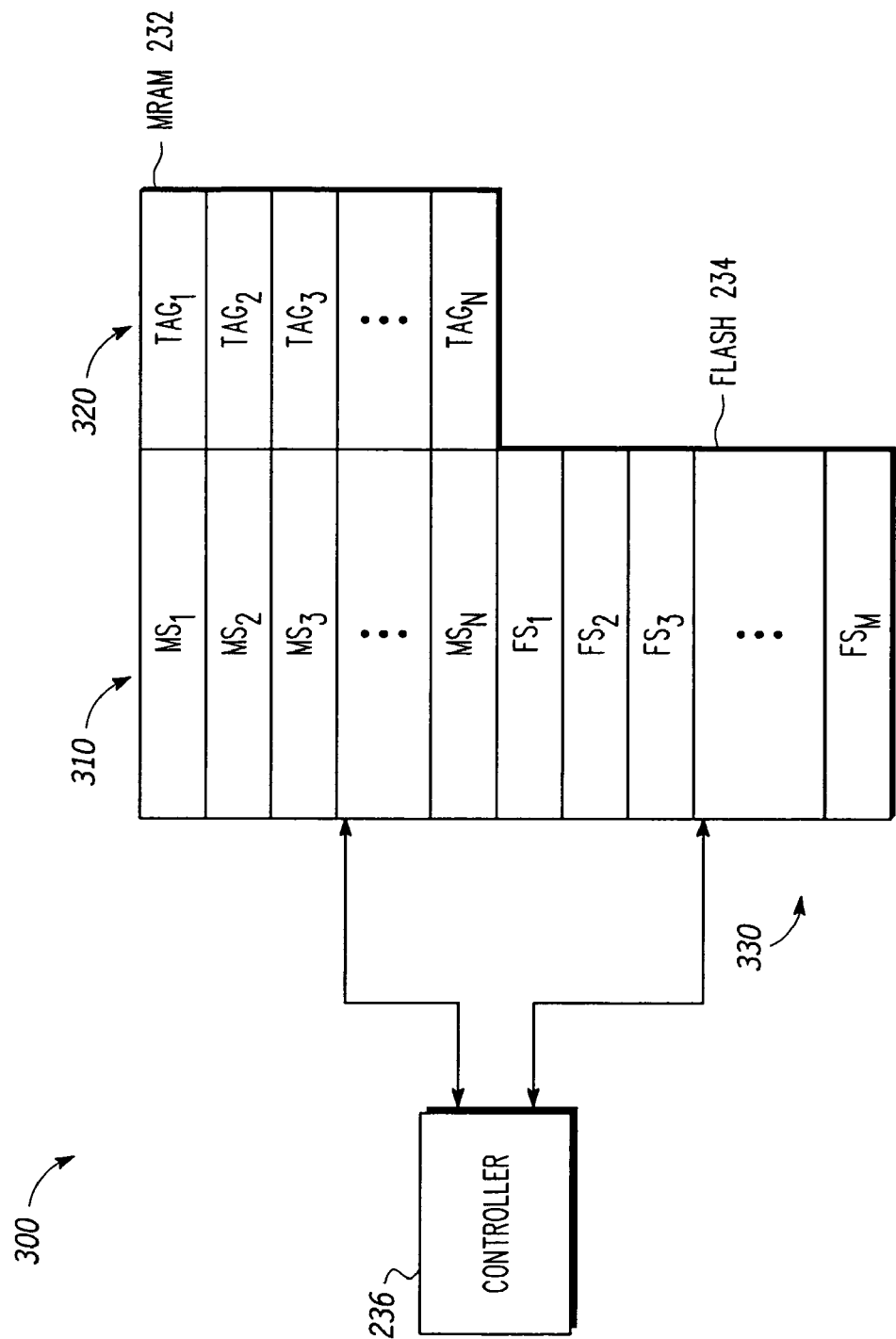
FIG. 3 illustrates a block diagram of the non-volatile memory system of FIG. 2.

FIG. 2 illustrates in block diagram form a computer system 200 according to the present invention. Computer system 200 includes a microprocessor 210 and a non-volatile memory system 230 both connected to a system bus 220. System bus 220 conducts address, data, and control signals to allow microprocessor 210 to perform read and write accesses to memory system 230 and other memory and input/output devices not shown in FIG. 2.

Non-volatile memory system 230 includes a magneto-resistive random access memory (MRAM) 232, a flash electrically erasable programmable read only memory (FLASH) 234, and a controller 236 bidirectionally connected to both MRAM 232 and FLASH 234 for controlling the operation thereof. By including both MRAM 232 and FLASH 234 and controlling them as will be described more fully below, non-volatile memory system 230 leverages the features and abilities of MRAM 232 to overcome the problems normally associated with FLASH 234 including long write and erase latency and limited endurance.

FIG. 3 illustrates a block diagram 300 of non-volatile memory system 230 of FIG. 2 including details of MRAM 232 and FLASH 234 important in understanding the present invention. As in FIG. 2, controller 236 includes bidirectional connections to both MRAM 232 and FLASH 234. MRAM 232 is shown in greater detail as including a group of n MRAM sectors 310 labeled "$MS_1$" through "$MS_n$", and a corresponding group of n tags 320 labeled "$TAG_1$" through "$TAG_n$" and respectively associated with MRAM sectors $MS_1$ through $MS_n$. FLASH 234 is also shown in greater detail as including a group of m FLASH sectors 330 labeled "$FS_1$" through "$FS_m$".

Figure 4:
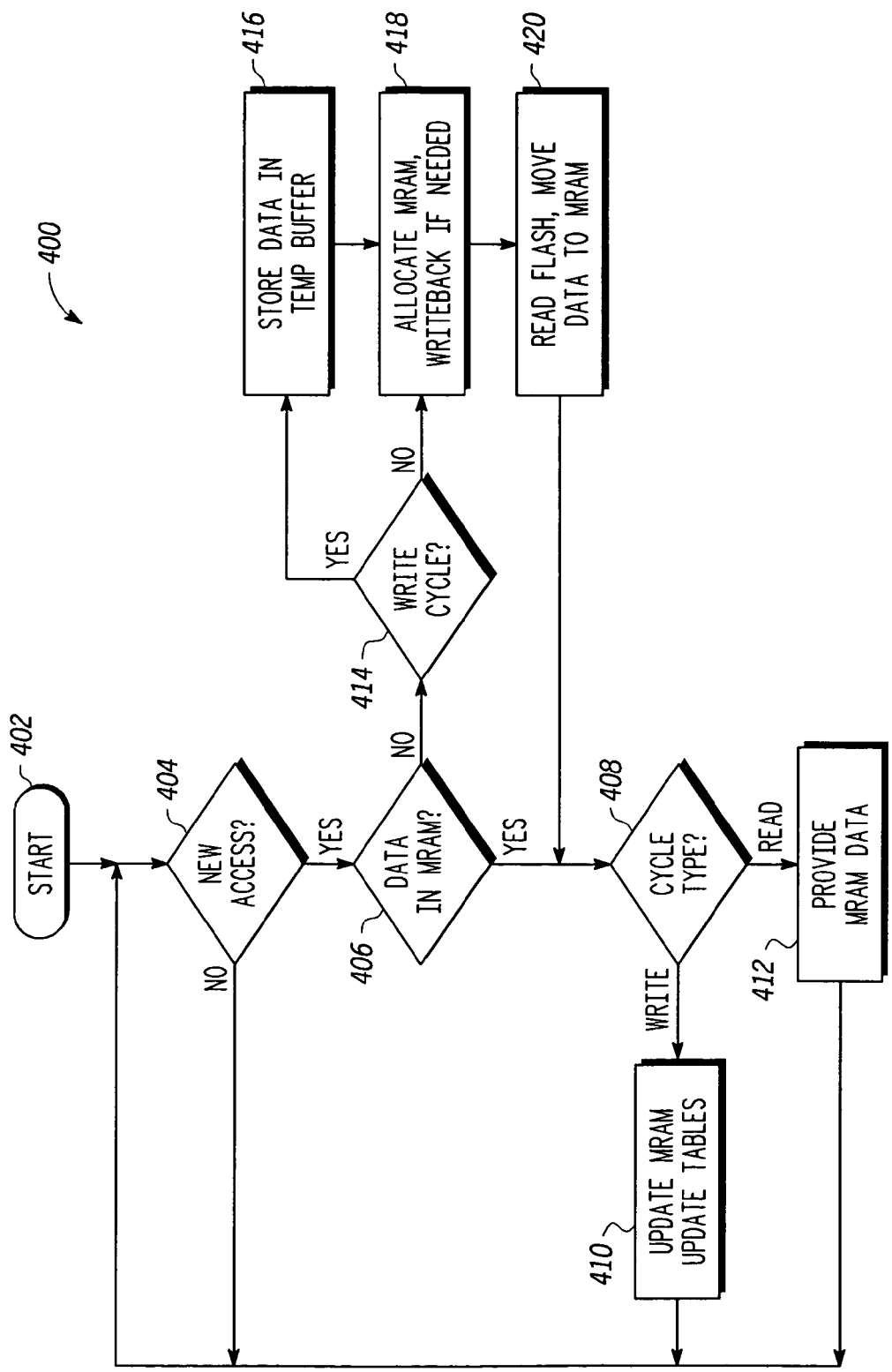
FIG. 4 illustrates a flow chart of the operation of the controller of FIG. 3 according to one embodiment of the present invention.

Controller 236 is responsive to an access cycle initiated by a device such as microprocessor 210 on system bus 220 to perform the requested memory transfer or perform the operation indicated by the control signals on system bus 220. Controller 236 uses MRAM 232 to reduce the apparent latency of an access to the memory space of FLASH 234 by making MRAM 232 a buffer for write and erase accesses. This operation is better understood with reference to FIG. 4, which illustrates a flow chart 400 of the operation of controller 236 of FIG. 3 according to one embodiment of the present invention. In this embodiment the size of the sectors in MRAM 232 and FLASH 234 is arbitrary. The flow starts at step 402 and controller 236 checks for a new access cycle at decision box 404. When a new access cycle is received, controller 236 next determines, at decision box 406, whether the read or write data is in a sector that has been allocated to MRAM 232. If the data has been allocated to MRAM 232, then controller 236 next determines, at decision box 408, whether the access cycle is a read cycle or a write cycle. If the access cycle is a write cycle, then controller 236, at step 410, writes the data to MRAM 232 and updates internal tables to indicate that a corresponding sector of MRAM 232 contains modified data. If the access cycle is a read cycle, then the data is read from MRAM 232 at step 412, because MRAM 232 includes the most recent copy of the data.

If the data is not present in MRAM 232, then controller 236 next determines, at decision box 414, whether the access cycle is a read cycle or a write cycle. If the access cycle is a write cycle, then controller 236, at step 416, receives the data pending allocation of the data in MRAM 232 and completes the write access with no apparent latency. After either determining that the cycle is not a write cycle or after storing write data in a temporary buffer at step 416, controller 236 allocates a sector of MRAM 232 to correspond to the accessed sector, performing a writeback of another MRAM sector to flash 234 if needed (if all sectors have been previously allocated). Then at step 420 data is copied from a sector of FLASH 234 into a selected sector of MRAM 232, combining it with write data from the temporary buffer in the case of a write cycle.

Figure 5:
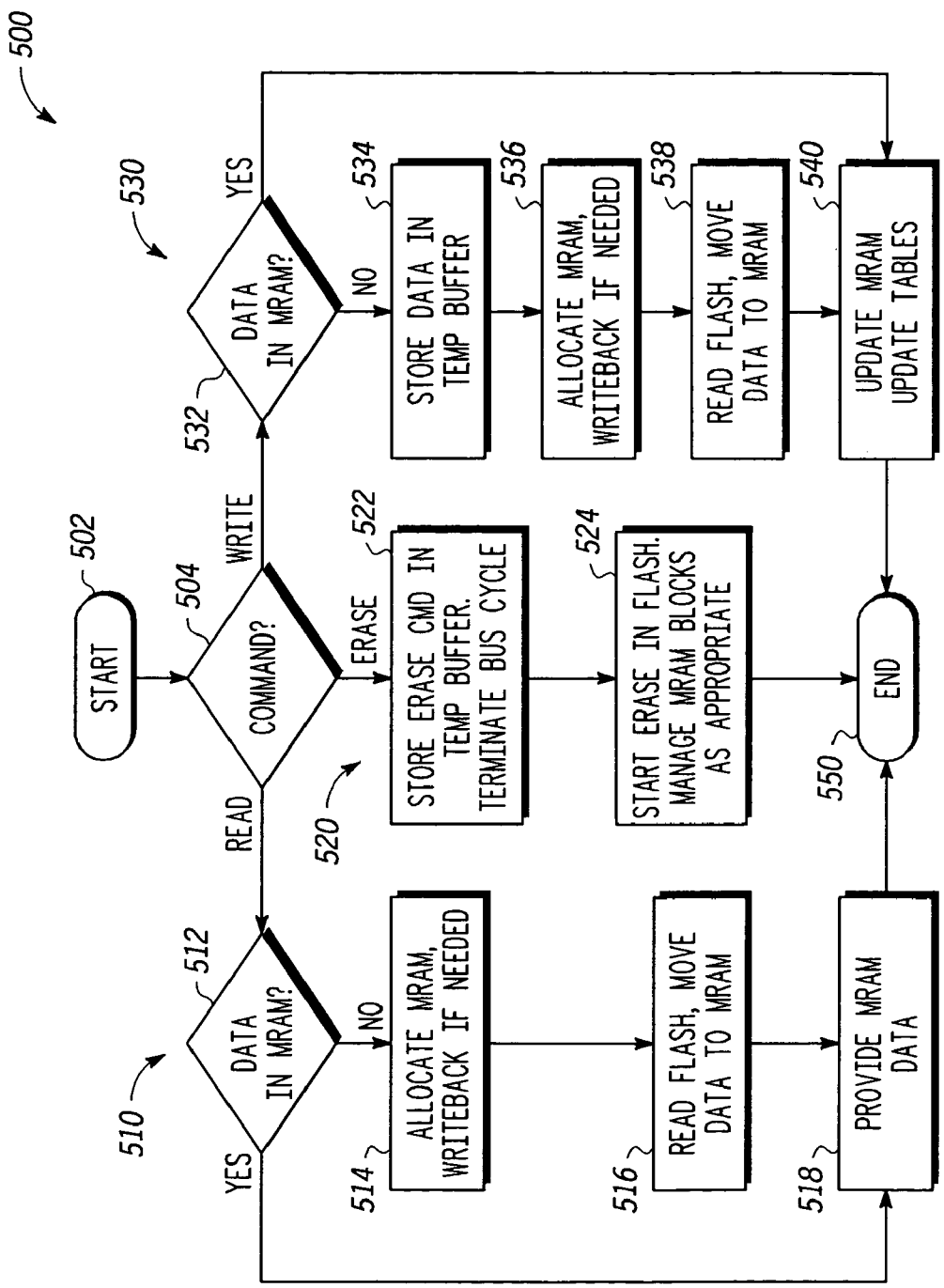
FIG. 5 illustrates a flow chart of the operation of the controller of FIG. 3 according to another embodiment of the present invention.

FIG. 5 illustrates a flow chart 500 of the operation of the controller of FIG. 3 according to another embodiment of the present invention. In this embodiment the sector sizes are the same. The flow starts at step 502 and controller 236 checks for a new access cycle at step 504. As illustrated in FIG. 5, the access cycle is in the form of a FLASH-type command, either read, write, or erase. Controller 236 performs sub-flows 510, 520, or 530 depending on whether the access cycle is a read cycle, an erase cycle, or a write cycle, respectively.

If the access cycle is a read cycle, then controller 236 proceeds to sub-flow 510. Controller 236 determines, at decision box 512, whether the read data is in a sector that has been already allocated to MRAM 232. If the read data is in a sector that has not been allocated to MRAM 232, then controller 236 allocates the data to MRAM 232 at step 514 by storing the address of the access cycle in a TAG, copying the data from FLASH 234 to MRAM 232, and setting a corresponding valid bit in the TAG. Note that if any of the sectors of MRAM 232 is empty, i.e., it does not have its valid bit set, then controller 236 selects one of the non-allocated sectors to allocate to the selected sector. If all sectors have been previously allocated, then controller 236 writes back the data of one of the previously-allocated sectors into FLASH 234 before copying the selected sector data. Note as is conventional a write (program) cycle to FLASH 234 is preceded by an erase cycle. Then regardless of whether data has been allocated controller 236 provides data from MRAM 232 to system bus 220 at step 518 to compete the read access.

If the access cycle is an erase cycle, then controller 236 proceeds to sub-flow 520. Controller 236 first stores information about the erase command in a temporary buffer, and terminates the erase cycle. Thus the erase cycle appears to system bus 220 to have no latency. Next at step 524, controller 236 starts the erase cycle in FLASH 234 while continuing to manage sectors of MRAM 232 as appropriate.

If the access cycle is a write cycle, controller 236 proceeds to sub-flow 530. Controller 236 determines, at decision box 532, whether the accessed data is present in MRAM 232. If not, then controller 236 stores the write data in a temporary buffer at step 534 and terminates the cycle on system bus 220. Then at step 536 controller 235 allocates a sector of MRAM 232, writing a sector containing old data back if necessary. Then at step 538 controller 236 copies the sector to a selected sector of MRAM 232 by reading FLASH 234 and moving the data so read into MRAM 232, combining it with the write data from the temporary buffer as necessary. Then controller 236 updates the TAGs in MRAM 232 with the address of the corresponding sector in FLASH 234, and updates the bits that indicate the sector has been allocated.

Figure 6:
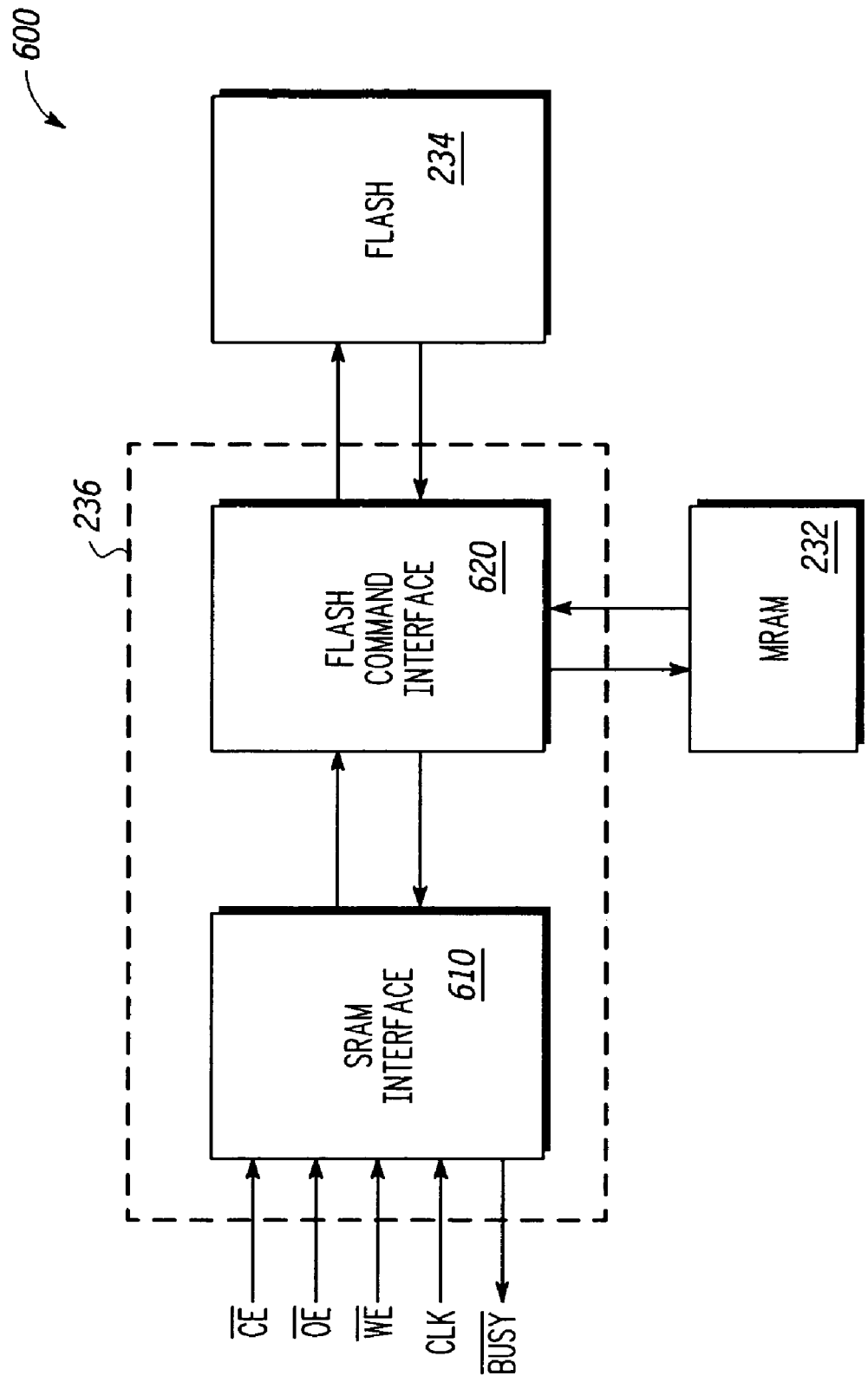
FIG. 6 illustrates in block diagram form additional details of the non-volatile memory system of FIG. 2 according to another aspect of the present invention.

FIG. 6 illustrates in block diagram form additional details of the non-volatile memory system of FIG. 2 according to another aspect of the present invention. As shown in FIG. 6, controller 236 includes a static random access memory (SRAM) interface 610 and a FLASH command interface 620. SRAM interface 610 is connected to system bus by a set of control signals normally associated with SRAMs: a chip enable output signal ($\overline{CE}$), a output enable signal ($\overline{OE}$), a write enable signal ($\overline{WE}$), an input clock signal CLK, and a control signal labeled "$\overline{BUSY}$". Address and data signals are not shown in FIG. 6. SRAM interface 610 recognizes standard SRAM control signals CE, OE, and WE and in addition a synchronous clock signal CLK in order to perform the read and write accesses as further described above. SRAM interface 610 then provides information to FLASH command interface 620 to control MRAM 232 and FLASH 234 as described above. By including SRAM interface 610, controller 236 allows non-volatile memory system 600 to appear to the system as fast low- or zero-latency SRAM, which is capable of retaining its contents when power is removed.

Note that FLASH 234 could be implemented by any known FLASH technology including NOR FLASH, NAND FLASH, and have single or multiple bits per cell.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A non-volatile memory system comprising:
   a magnetoresistive random access memory (MRAM);
   a flash nonvolatile memory; and
   a controller coupled to said MRAM and to said flash nonvolatile memory and adapted to be coupled to a system bus for controlling a selected one of said MRAM and said flash nonvolatile memory in response to an access cycle initiated from said system bus.

2. The nonvolatile memory system of claim 1 wherein when said access cycle is a write cycle of a data element to an address within a memory space of said flash nonvolatile memory, said controller writes said data element to said MRAM instead of to said flash nonvolatile memory.

3. The nonvolatile memory system of claim 2 wherein said controller further terminates said write cycle after writing said data element to said MRAM without writing said data element to said flash nonvolatile memory, thereby reducing write latency.

4. The nonvolatile memory system of claim 1 wherein said controller controls said MRAM instead of said flash nonvolatile memory to perform said access cycle when an address of said access cycle has been allocated to said MRAM.

5. The nonvolatile memory system of claim 1 wherein said controller includes a static random access memory (SRAM) interface having inputs for receiving a chip enable signal, an output enable signal, and a write enable signal.

6. The nonvolatile memory system of claim 5 wherein said SRAM interface further has an input for receiving a clock signal and performs said access cycle synchronously with said clock signal.

7. The nonvolatile memory system of claim 5 wherein said SRAM interface has an output for providing a busy signal to indicate that said access cycle is in progress when said controller performs said access cycle to said flash nonvolatile memory.

8. A non-volatile memory system comprising:
   a magneto-resistive random access memory (MRAM) having a plurality of sectors and a corresponding plurality of tags, wherein each of said plurality of tags indicates an address of a corresponding one of said plurality of sectors;
   a flash nonvolatile memory; and
   a controller coupled to said MRAM and to said flash nonvolatile memory and adapted to be coupled to a system bus, wherein in response to an access cycle received from said system bus, said controller determines whether an address of said access cycle is stored in one of said plurality of tags and if so performs said access cycle to a corresponding one of said plurality of sectors of said MRAM instead of to said flash nonvolatile memory.

9. The nonvolatile memory system of claim 8 wherein if said address of said access cycle is not stored in one of said plurality of tags, said controller allocates an address from said flash nonvolatile memory to a selected sector of said plurality of sectors of said MRAM and performs said access cycle to said selected sector instead of to said flash nonvolatile memory.

10. The nonvolatile memory system of claim 9 wherein said controller allocates said address from said flash nonvolatile memory to said selected sector of said MRAM by copying a corresponding sector from said flash nonvolatile memory to said selected sector and storing an address of said corresponding sector in a corresponding tag of said plurality of tags.

11. The nonvolatile memory system of claim 10 wherein said controller allocates said corresponding sector to said MRAM further by setting a valid bit corresponding to said selected sector in said MRAM.

12. The nonvolatile memory system of claim 9 wherein said controller writes back old data from said selected sector to said flash nonvolatile memory before allocating said address if all of said plurality of sectors of said MRAM have been previously allocated when the nonvolatile memory system receives said access cycle.

13. The nonvolatile memory system of claim 8 wherein in response to a write cycle in which said address of said access cycle is not stored in one of said plurality of tags, said controller stores write data in a temporary buffer and terminates said access cycle on said system bus before allocating said address to said MRAM.

14. The nonvolatile memory system of claim 8 wherein in response to an erase cycle the nonvolatile memory system terminates said erase cycle on said system bus and subsequently erases a corresponding sector in said flash nonvolatile memory.

15. The nonvolatile memory system of claim 8 further comprising a static random access memory (SRAM) interface having inputs for receiving a chip enable signal, an output enable signal, and a write enable signal.

16. A method of controlling a non-volatile memory system that includes a magneto-resistive random access memory (MRAM) and a flash nonvolatile memory comprising the steps of:
receiving an access cycle from a system bus;
determining whether said access cycle is a write cycle;
if said access cycle is said write cycle, storing write data in a temporary buffer, terminating said write cycle on said system bus, and subsequently storing said write data in the MRAM.

17. The method of claim 16 further comprising the steps of:
determining whether an address associated with said access cycle has been allocated to the MRAM;
if said address associated with said access cycle has been allocated to the MRAM, storing said write data in the MRAM; and
if said address associated with said access cycle has not been allocated to the MRAM, allocating said address to the MRAM from said flash nonvolatile memory and then storing said write data in the MRAM.

18. The method of claim 17 further comprising the steps of:
if said address associated with said access cycle has not been allocated to the MRAM and all sectors of the MRAM have been allocated, writing back a selected sector containing old data to the flash nonvolatile memory and subsequently storing said write data in said selected sector.

19. The method of claim 18 wherein the step of writing back said selected sector containing said old data to the flash nonvolatile memory comprises the step of:
selecting a sector of the MRAM which includes the most updates as said selected sector.

20. The method of claim 16 further comprising the step of:
determining whether said access cycle is an erase cycle; and
if said access cycle is said erase cycle, terminating said erase cycle on said system bus, and subsequently erasing a corresponding sector of the flash nonvolatile memory.

* * * * *